United States Patent [19]
Brown

[11] Patent Number: 6,148,512
[45] Date of Patent: Nov. 21, 2000

[54] METHOD FOR ATTACHING AN ELECTRONIC DEVICE

[75] Inventor: Vernon L. Brown, Barrington, Ill.

[73] Assignee: Motorola, Inc., Schaumburg, Ill.

[21] Appl. No.: 08/636,098

[22] Filed: Apr. 22, 1996

[51] Int. Cl.[7] ........................ H05K 3/30
[52] U.S. Cl. .................. 29/837; 29/840; 29/843
[58] Field of Search .............. 29/840, 843, 842, 29/837, 874, 878, 879, 885

[56] References Cited

U.S. PATENT DOCUMENTS

| | | | |
|---|---|---|---|
| 4,902,610 | 2/1990 | Shipley | 430/312 |
| 4,967,313 | 10/1990 | Berner | 361/400 |
| 5,162,144 | 11/1992 | Brown et al. | 428/209 |
| 5,203,075 | 4/1993 | Angulas et al. | 29/830 |
| 5,246,817 | 9/1993 | Shipley, Jr. | 430/312 |
| 5,260,170 | 11/1993 | Brown | 430/315 |
| 5,317,801 | 6/1994 | Tanaka et al. | 29/830 |
| 5,341,564 | 8/1994 | Akhavain et al. | 29/832 |
| 5,384,952 | 1/1995 | Mtsui | 29/840 |
| 5,434,751 | 7/1995 | Cole, Jr. et al. | 361/792 |
| 5,611,140 | 3/1997 | Kulesza et al. | 29/832 |
| 5,891,606 | 4/1999 | Brown | 430/312 |

*Primary Examiner*—Lee Young
*Attorney, Agent, or Firm*—Douglas D. Fekete

[57] ABSTRACT

A method for attaching a flip chip or other microelectronic device to a circuit board or other substrate. The method entails the forming of recesses having precise volumes above and surrounding each terminal pad so as to enable the deposition on each pad of a controlled volume of conductive material, such that reduced spacing between terminals can be enabled. If a conductive adhesive is used as the conductive material, the method drastically reduces the likelihood that an inadequate amount of adhesive will be deposited, while excess adhesive can be accommodated without causing shorting between adjacent terminals. If flip chip attachment is achieved with a solder composition, the method eliminates the prior art requirement for circuit board terminal bumping and bump flattening.

18 Claims, 3 Drawing Sheets

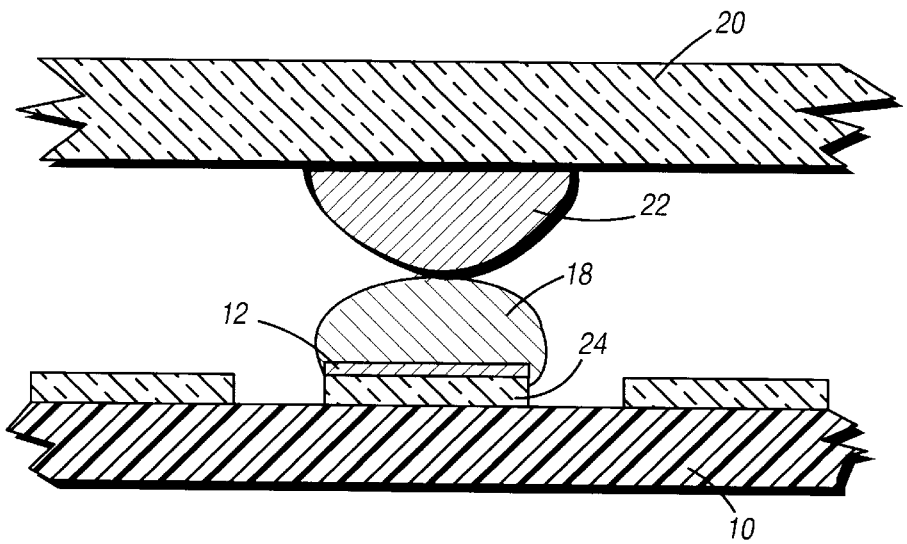
FIG.1 —PRIOR ART—
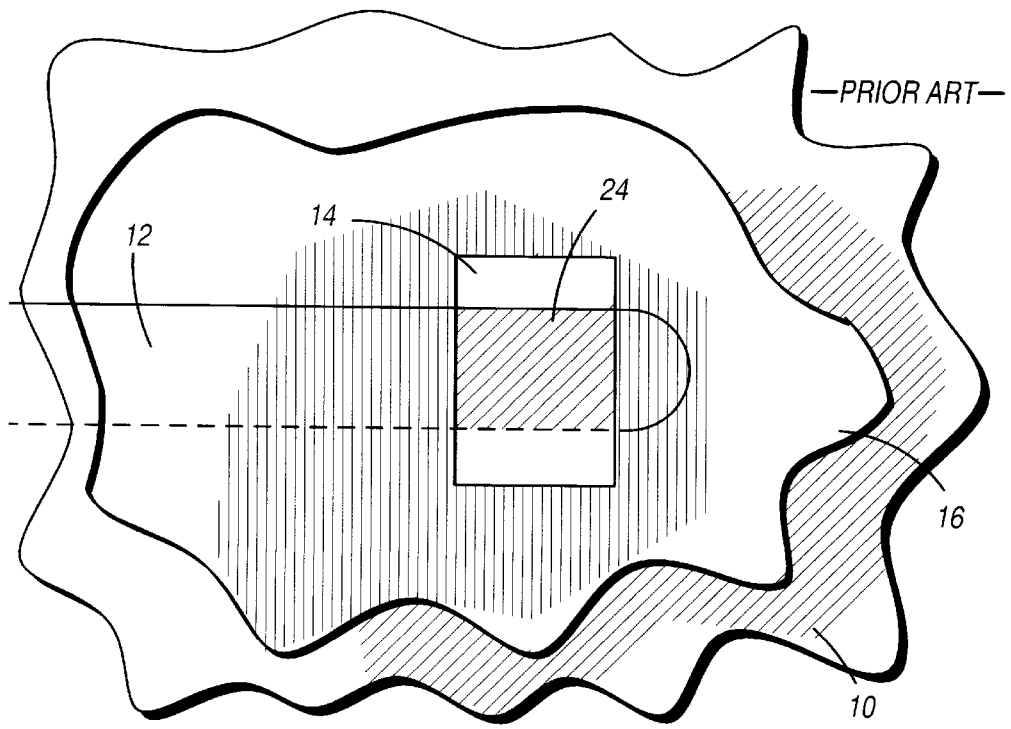
FIG.2 —PRIOR ART—

METHOD FOR ATTACHING AN ELECTRONIC DEVICE

FIELD OF THE INVENTION

The present invention generally relates to methods for attaching flip chips and other electronic devices to a circuit board. More particularly, this invention relates to a method that promotes registration and reliable attachment of an electronic device with its associated terminal pattern on a substrate, prevents shorting between adjacent terminals, and enables accurate volume control of the conductive material employed to attach the device to its terminal pattern.

BACKGROUND OF THE INVENTION

Flip chips are monolithic semiconductor devices, such as integrated circuits, having bead-like terminals formed on one surface of the chip. The terminals, commonly referred to as bumps, serve to both secure the chip to a circuit board and electrically interconnect the flip chip's circuitry to a conductor pattern formed on the circuit board, which may be a ceramic substrate, printed wiring board, flexible circuit, or a silicon substrate. The bumps are generally formed by selectively depositing a metal on the flip chip. One known method is to selectively electroplate a solder composition on the flip chip, and then reflow the solder composition by heating the composition above its liquidus temperature so that the molten material coalesces to form the bumps on the surface of the chip. During the attachment operation, such bumps are registered with their corresponding conductors and then reheated above the solder composition's liquidus temperature in order to bond the chip to the conductors.

Alternatively, the bumps on a flip chip can be formed by a metal composition that is not reflowed during attachment. These may be formed by evaporation of the metal through a mask, or electrolessly or electrolytically plating the metal or combinations of metals. Bumps may also be formed by wire-bonding a gold wire, which has been flame reflowed, to the chip terminals, and then breaking the wire to form a quasi-spherical bump that is then flattened such that the surfaces of the terminals are planar. The preformed terminal bumps on the flip chip are then registered with conductive material that was previously deposited on each of the conductors to which the terminal bumps are to be electrically interconnected. The conductive material can be a conductive adhesive that attaches the flip chip to the circuit board and makes the electrical connection between the flip chip terminals and their conductors. Alternatively, the conductive material may be a solder composition that is selectively deposited with a stencil, screen or mask onto a portion of the conductors to form a suitable terminal pattern on the circuit board. FIG. 2 illustrates such a technique, in which a portion of a conductor 12 formed on a substrate 10 is exposed by an opening 14 in a mask 16 to form a terminal pad 24. When opening 14 is rectangular, the exposed portion of conductor 12 has a rectangular shape. The potential for misregistration of conductor 12 relative to opening 14 in mask 16 necessitates that opening 14 be large enough that the total width and sidewalls of conductor 12 are not obscured by mask 16. Consequently, portions of substrate 10 are also exposed by mask 16, as depicted in FIG. 2.

Inherently, the volume of conductive material used to secure a terminal bump of a flip chip to terminal pad 24 cannot be precisely controlled due to these same tolerances. If the conductive material is an adhesive, it is especially difficult to precisely deposit the adhesive in sufficiently-controlled volumes that will ensure attachment yet remain isolated from each other after the flip chip has been registered. Furthermore, because it is often advantageous in an electronic design to run conductor traces between adjacent chip terminals, misregistration of mask 16 can expose one of these traces in the same opening 14 as conductor 12 for terminal pad 24, resulting in a short when the conductive material is deposited in opening 14. This consequence can only be prevented by limiting the closeness of the trace to terminal pad 24, which severely limits the desirable ability to run traces between adjacent terminals pads 24. Consequently, inadequate adhesion and shorting between adjacent terminals and between terminals and their adjacent traces are significant challenges with the use of either conductive adhesives or solder to attach flip chips to circuit boards.

FIG. 1 illustrates the use of a solder composition as the conductive material for attaching a bump 22 of a flip chip 20 to a terminal pad 24. Electroplated solders are typically deposited through a mask such as that represented in FIG. 2, while solder pastes are typically deposited with a stencil or screen. With either approach, the solder composition is typically deposited onto substrate 10 in a relatively large amount to maximize volume, i.e., more than is required to cover the exposed portions of conductor 12 and substrate 10, and then heated to liquefy the solder. On liquefication, the solder coalesces to form a solder bump 18, with surface tension causing bump 18 to form on terminal pad 24 and acquire the semi-spherical shape shown. Flip chip 20 is then attached to the circuit board by registering bump 22 with solder bump 18, and then reflowing solder bump 18 to attach and electrically interconnect bump 22 with terminal pad 24.

FIG. 1 illustrates a difficulty with the use of solder bumps, in which terminal bumps 22 on chip 20 are prone to becoming misregistered with solder bumps 18 on the circuit board due to the semi-spherical shape of solder bumps 18. Specifically, terminal bumps 22 tend to slide off their solder bumps 18 due to the round shape of bumps 18 and 22, such that any further lateral movement of flip chip 20 relative to substrate 10 leads to loss of thermal contact between terminal bumps 22 and their corresponding solder bumps 18. Consequently, a flattening operation is typically necessary to provide flatter surfaces on which bumps 22 of chip 20 can be registered. The additional flattening operation is undesirable from the standpoint of processing time and costs. In addition, the use of flip chips on opposite sides of a circuit board is deterred or prevented because the flattened bumps on the side opposite to that being soldered will reflow to reacquire their preflattened semi-spherical shape.

The above-noted difficulties associated with the use of conductive adhesives and solder compositions are further aggravated by current trends in the electronic industry that impose significant size constraints to achieve smaller electronic packages. Such constraints often dictate finer pitch conductors and solder bumps than the typical 125 micrometers (about five mils) attainable by the board bumping process described above.

As can be appreciated from the above, prior art processes for attaching chips to a terminal pattern of a circuit board are rather complex and costly. In addition, precise volume control of the conductive material is difficult due to the dimensional and registration tolerances associated with masks, screens and stencils used to deposit such materials. The net effect is that the spacing between terminals must be much larger than is desired, such that the above flip chip attachment techniques cannot be used with many otherwise applicable integrated circuits having a pitch smaller than about 0.4 millimeters (about sixteen mils). Finally, imprecise volume control of the conductive material increases the likelihood of inadequate adhesion if insufficient material is deposited, or shorting between terminals if excessive material is deposited.

SUMMARY OF THE INVENTION

According to the present invention, there is provided an improved technique by which flip chips and other bumped microelectronic devices can be attached to a circuit board or other substrate. Specifically, the method enables the deposition on a circuit board terminal pattern of a controlled volume of conductive material, such that reduced spacing between terminals can be enabled. If a conductive adhesive is used as the conductive material, the method drastically reduces the likelihood that an inadequate amount of adhesive will be deposited, while excess adhesive can be accommodated without causing shorting between adjacent terminals. In terms of flip chip attachment with a solder composition, the method eliminates the prior art requirement for solder bump flattening.

The method of this invention generally includes the steps of forming metal regions on a substrate, preferably such that the upper surfaces of the metal regions are recessed below a surrounding surface region. This configuration can be attained by depositing a dielectric layer on the substrate and over the metal regions, such that the upper surface of the dielectric layer lies in a plane above the upper surfaces of the metal regions. Openings are then formed in the dielectric layer to expose at least a portion of each metal region. Alternatively, a dielectric layer can be deposited and patterned, with metal being deposited through the patterned openings in the dielectric layer to form the metal regions. Importantly, the openings in the dielectric layer are formed such that the size of each exposed metal region is precisely determinable, and a first recess formed by each opening has a precise volume delineated by and between planes defined by the upper surfaces of the metal regions and the dielectric layer. For this reason, the dielectric layer is preferable formed by a photodefinable resin that can be accurately photoimaged and developed to precisely form the openings.

In an alternate embodiment, a second dielectric layer, again preferably a photodefinable resin, is then deposited over the first dielectric layer and the exposed metal regions, and openings are formed in the second dielectric layer to re-expose those portions of the metal regions that were originally exposed by the first dielectric layer. Importantly, the openings in the second dielectric layer are formed so as to also expose precisely determinable portions of the first dielectric layer, such that each of the openings in the second layer forms a second recess having a precise volume delineated by and between planes defined by the upper surfaces of the first and second dielectric layers. Furthermore, the openings in the second dielectric layer are sized such that the volume of each of the second recesses is greater than the volume of their corresponding first recesses.

A conductive material, such as a conductive adhesive or solder composition, is then deposited in the recesses and on the exposed metal regions. The conductive material can be deposited in the recess in an amount sufficient to fill the first recess but less than the combined volume of the first and second recesses. Alternatively, the conductive material can be deposited using the second dielectric layer as a stencil, such that the combined volumes of both recesses are filled. A flip chip is then positioned on the substrate such that its terminal bumps are received in the recesses and contact the conductive material so as to be electrically interconnected with their respective metal regions. Importantly, the sizes of the openings in the second dielectric layer are such that the second dielectric layer limits lateral movement of the terminal bumps within the recesses, to the extent necessary to maintain the bumps in contact with the conductive material within their respective recesses.

According to this invention, if the conductive material is a conductive adhesive, the openings are sized such that each of the second recesses formed by the second dielectric layer serves as a reservoir for any excess adhesive that is displaced from the first recess by the terminal bumps of the flip chip. As such, the conductive adhesive is prevented from causing a short with an adjacent terminal bump or metal region. If the conductive material is a solder paste, reflowing the solder paste prior to positioning the flip chip will conventionally yield a semispherically-shaped solder bump on each of the metal regions. However, in contrast to the prior art, these solder bumps need not be flattened because the terminal bumps of the flip chip remain in contact with the solder bumps due to the walls of the openings in the second dielectric layer limiting movement of the terminal bumps within the recesses. Because the solder bumps need not be flattened to maintain contact between the solder bumps and the terminal bumps of a flip chip, this invention facilitates the placement of flip chips on opposing surfaces of circuit board or substrate.

Alternatively, the flip chip can be registered with the solder paste prior to reflow, since the openings can be precisely sized to eliminate the presence of excess solder paste. As such, after reflow the solder in the recesses will form solder "columns" of nearly identical size, thereby assuring proper attachment of the flip chip to the substrate.

BRIEF DESCRIPTION OF THE DRAWINGS

The above and other advantages of this invention will become more apparent from the following description taken in conjunction with the accompanying drawings, in which:

FIG. 1 is a cross-sectional view of a flip chip and its terminal bump as they appear immediately after being registered with a solder bump on a circuit board, in which the solder bump is shown as having reacquired a semispherical shape following reflow soldering on the opposite side of the circuit board, in accordance with the prior art;

FIG. 2 is a plan view of a substrate with a portion of a conductor exposed by a mask prior to deposition of a conductive material on the exposed portion in accordance with the prior art;

DETAILED DESCRIPTION OF A PREFERRED EMBODIMENT

Figure 3:
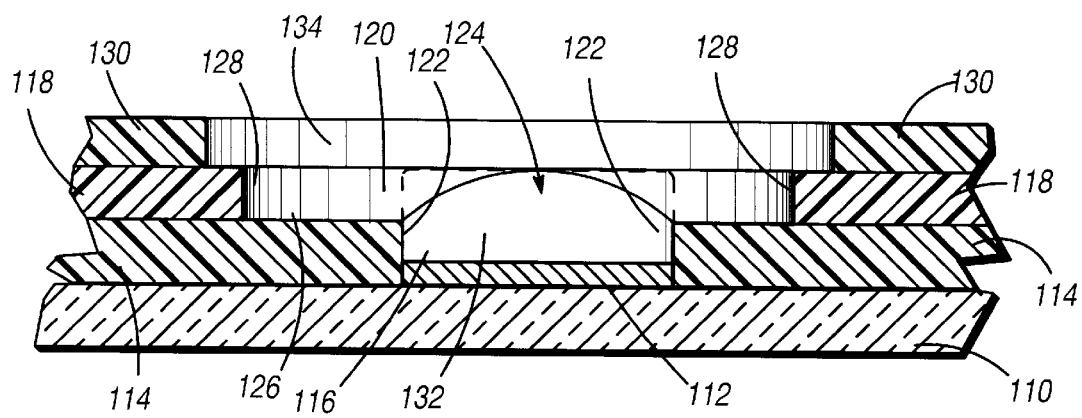
FIG. 3 is a cross-sectional view of a circuit board immediately after solder deposition and reflow in accordance with a first embodiment of this invention.
Figure 4:
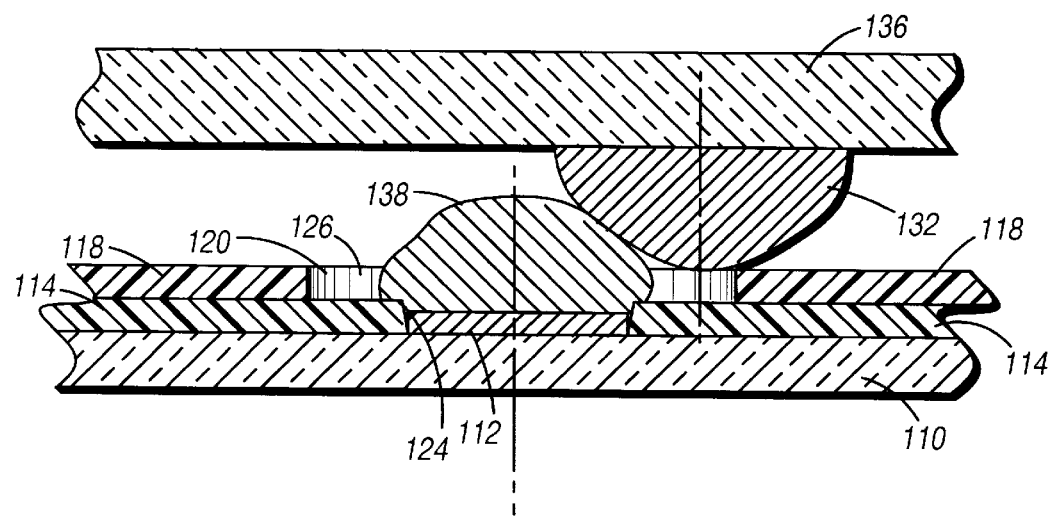
FIG. 4 is a cross-sectional view of a flip chip and its terminal bump as they appear immediately after being registered with the solder bump of FIG. 3 and prior to reflowing the solder to attach the flip chip to the circuit board.
Figure 5:
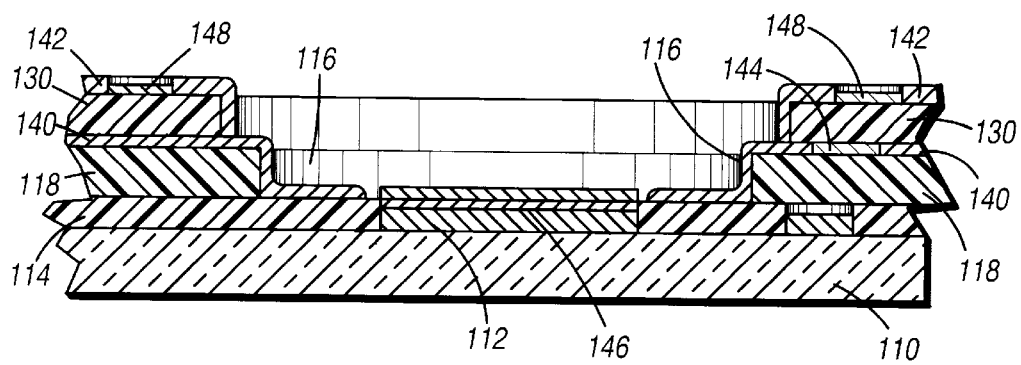
FIG. 5 is a cross-sectional view of a circuit board prior to solder deposition in accordance with a second embodiment of this invention.
Figure 6:
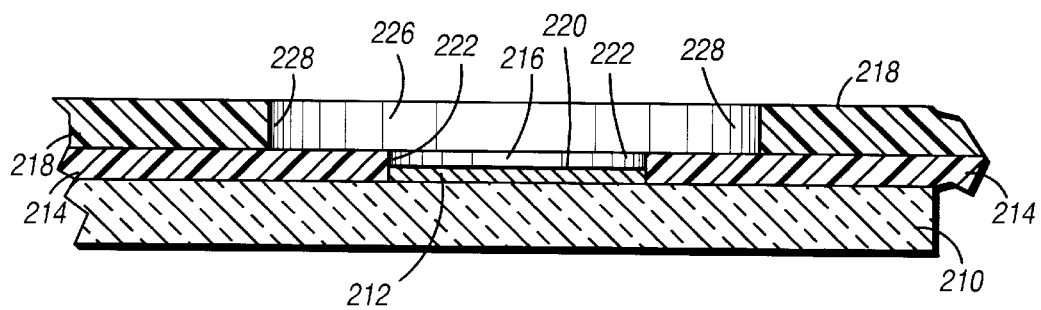
FIG. 6 is a cross-sectional view of a circuit board prior to deposition of a conductive material in accordance with a third embodiment of this invention.
Figure 7:
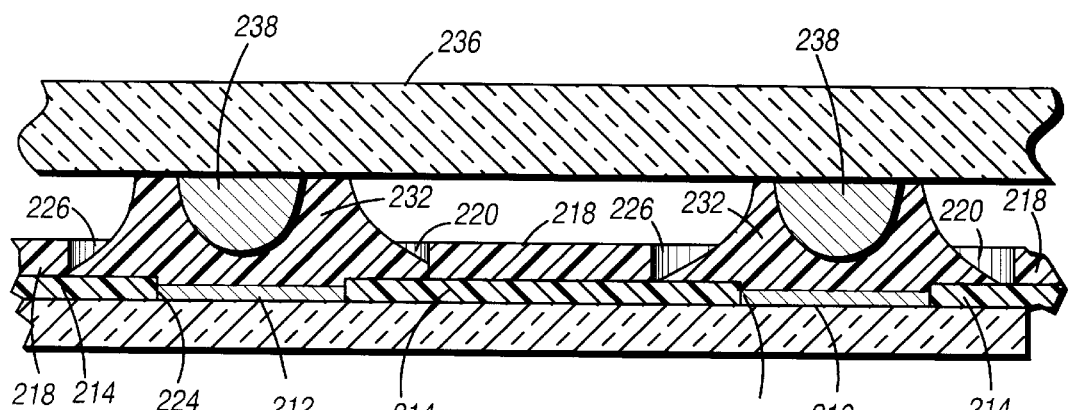
FIG. 7 is a cross-sectional view of a flip chip and its terminal bump as they appear immediately after being registered with a conductive adhesive deposited on the circuit board of FIG. 3.

The present invention is directed to a method for attaching a flip chip or other bumped microelectronic device to a circuit board or other appropriate substrate. The method entails sequentially processing multiple permanent dielectric layers, in which at least one of the dielectric layers serves as a mask for defining a terminal pattern with which the terminal bumps of the flip chip can be registered. An embodiment of this invention directed to flip chip attachment with solder is represented in FIGS. 3 through 5, while an embodiment directed to flip chip attachment with a conductive adhesive is represented in FIGS. 6 and 7. The multi-layer circuit board constructions described and represented in FIGS. 3 through 7 are intended to illustrate the advantageous features of this invention, but are not to be interpreted as limitations to the scope of the invention.

Referring to FIG. 3, a substrate 110 is shown on which a metal pad 112, typically formed of copper or a copper alloy, have been formed. Metal pad 112 is one of a number of pads that form a terminal pattern with which a flip chip or other bumped device can be registered and then attached with a conductive material, such as solder or a conductive adhesive, as will be discussed in detail below. Substrate 110 can be formed from any suitable insulating material, such as plastic, wood, composite, MYLAR, ceramic, or any other suitable electrically insulating material. Those skilled in the art will appreciate that substrate 110 could be a printed circuit layer of a multi-layer circuit board, and subsequent reference to substrate 110 is intended to encompass such variations.

Shown overlying substrate 110 is a first dielectric layer 114 in which an opening 116 has been patterned. In a preferred embodiment of this invention, metal pad 112 is formed within opening 116 in dielectric layer 114, though it is foreseeable that metal pad 112 could be formed prior to deposition of dielectric layer 114. According to another preferred aspect of this invention, dielectric layer 114 is composed of a resin mixture containing a photosensitive material. The photosensitive material content of the resin mixture results in dielectric layer 114 being photodefinable, such that photoimaging and development techniques can be employed to pattern opening 116 in dielectric layer 114. The resin component of the resin mixture can be any suitable liquid resin or solid resin dissolved in a solvent, so as to enable the resin mixture to be readily deposited onto the surface of substrate 110 to form dielectric layer 114. Resins that could be used include thermoplastic resins, thermosetting resins, elastomers and mixtures thereof, which when incorporated with a photosensitive material yield a photodefinable resin mixture. Desirable properties for the resin mixture include dielectric and physical properties that remain stable throughout deposition, photoimaging and development of dielectric layer 114.

According to this invention, a preferred composition for dielectric layer 114 is a photodefinable resin disclosed in U.S. Pat. No. 5,162,144 to Brown et al. and U.S. Pat. No. 5,260,170 to Brown, each of which is commonly assigned with this invention and incorporated herein by reference. In accordance with the teachings of Brown et al. and Brown, a suitable resin component for the resin mixture is an epoxy, while suitable photosensitive materials include a composition available from Ciba-Geigy, Inc., under the trademark PROBIMER 61. Suitable photosensitivity is attained with the PROBIMER 61 material when a photoinitiator is present in amounts of about five percent of the total epoxide molecules that are cross-linked in the final, totally cured dielectric layer 114. Differing amounts of photoinitiator are recognized as being useful depending on the specific resin formulation, radiation source and image development process used.

The manner in which the resin mixture is deposited to form dielectric layer 114 will depend to some degree on the particular resin component of the mixture. A suitable thickness for dielectric layer 114 will depend in part on the particular application, though a suitable range is about fifteen to about twenty-five micrometers. Due to the presence of the photosensitive material, opening 116 in dielectric layer 114 can be photoimaged through a mask and developed in dielectric layer 114 in a manner consistent with the resin. As shown in FIG. 3 opening 116 is selectively sized to expose the entire metal pad 112 beneath dielectric layer 114, though it is within the scope of this invention that dielectric layer 114 could overlie the perimeter of metal pad 112. Alternatively, opening 116 could be sized to expose a portion of substrate 110.

Due to the precision possible with photodefinition techniques, the diameter of opening 116 can be closely controlled such that the resulting wall of dielectric layer 114 is superimposed over the perimeter of metal pad 112. As noted above, a preferred technique for achieving this result is to form metal pad 112 using dielectric layer 114 as a permanent mask, such that pad 112 is formed by depositing a metal in opening 116. Using this method, metal pad 112 can be formed by electroless plating or other suitable deposition methods to have a controlled thickness, and the volume of a recess 124 formed by opening 116 and delineated by the upper surface of metal pad 112 and a surrounding surface region 122 of dielectric layer 114 can be precisely controlled.

Also shown in FIG. 3 is a second dielectric layer 118 overlying first dielectric layer 114 and surrounding metal pad 112. As with first dielectric layer 114, second dielectric layer 118 is preferably composed of a resin mixture containing a photosensitive material, such as the material noted for first dielectric layer 114. As such, an opening 120 in second dielectric layer 118 can be precisely photodefined so as to expose metal pad 112 and surface region 122 of first dielectric layer 114. As shown, the diameter of second opening 120 is larger than that of opening 116 in first dielectric layer 114. Again, because of the precision possible with photoimaging techniques, an accurately-determinable volume can be obtained for a second recess 126 formed by opening 120 and delineated by surface region 122 of dielectric layer 114 and a surrounding surface region 128 of second dielectric layer 118. FIG. 3 also shows an optional third dielectric layer 130 that can be formed of the same photodefinable resin, deposited, photoimaged and developed to attain the configuration shown. Third dielectric layer 130 may be desirable for some applications in which a larger combined recess volume is desirable, particularly if third dielectric layer 130 is patterned to have an opening 134 that is larger than openings 116 and 120 of first and second dielectric layers 114 and 118.

According to this embodiment of the invention, a solder material, such as a solder paste or an electroplated solder alloy, is deposited on pad 112 and then reflowed to form a solder bump 132 having the semi-spherical shape shown. If a paste, the solder material can be selectively deposited with a stencil or screen in an amount sufficient to fill first recess 124 but less than that required to completely fill the combined volumes of first and second recesses 124 and 126. Alternatively, the solder paste can be deposited using third dielectric layer 130 if present, or second dielectric layer 118 if third layer 130 is not present, as a permanent mask, such that both recesses 124 and 126 are filled. Upon heating, the binder constituent typically employed in solder pastes would be volatilized and displaced to yield solder bump 132 shown in FIG. 3. It will be appreciated that bump 132 of FIG. 3 may be larger than shown, its sizing being dependent on the size of openings 116, 120 and 134, as well as the thicknesses of dielectric layers 114, 118 and 130.

The ability to produce the desired solder bump 132 having a controlled volume is made possible by the ability of this method to produce recesses having precisely controlled volumes, such that the size of bump 132 can be accurately controlled based on the initial quantity of solder paste deposited in the recesses, as shown in FIG. 3. In particular, the desired height for solder bump 132 is achieved by depositing dielectric layers 114, 118 and 130 in appropriate thicknesses, and then precisely forming openings 116, 120 and 134 to have diameters necessary to yield the desired volumes for the recesses.

FIG. 4 shows a flip chip 136 positioned over substrate 110 such that its terminal bump 138 is partially received in recess 126 and thermally contacts solder bump 132. As is apparent from FIG. 4, the size of opening 120 in second dielectric layer 118 is such that second dielectric layer 118 limits the lateral movement of terminal bump 138 within recess 126, to the extent necessary to maintain bump 138 in contact with solder bump 132. Therefore, and in contrast to the prior art, solder bump 132 need not be flattened to prevent misregistration of terminal bump 138 with solder bump 132. In this manner, the present invention facilitates the placement of a flip chip on the opposite surface of substrate 110, since the propensity for solder to acquire a semi-spherical shape during reflow does not interfere with or complicate flip chip registration.

Alternatively, flip chip 136 could be registered with the solder paste prior to reflow, since recesses 124 and 126 are precisely sized to eliminate the presence of excess solder paste. As such, after reflow the solder in recesses 124 and 126 will form solder "columns" of nearly identical size, thereby assuring proper attachment of flip chip 136 to pad 112. This variant eliminates the prior art requirements of board bumping and solder bump flattening, and therefore eliminates the entire circuit board pre-assembly process.

A second embodiment of this invention is shown in FIG. 5. According to this embodiment, second and third dielectric layers 118 and 130 are composed of a resin mixture containing a photosensitive material and a catalytic filler. A preferred composition for dielectric layers 118 and 130 is a second photodefinable resin disclosed in U.S. Pat. No. 5,162,144 to Brown et al. and U.S. Pat. No. 5,260,170 to Brown. According to Brown et al. and Brown, the catalytic filler is preferably metal oxide particles that constitute less than about ten weight percent of the resin-oxide mixture. A preferred metal oxide is cuprous oxide, though other oxides or catalytic fillers could be used, including a catalytic material available from Johnson-Matthey of New Jersey, USA, under the trademark CAT-10.

The embodiment of FIG. 5 generates a controlled-volume recess during the manufacture of the circuit board in accordance with Brown. Following formation of opening 116 in second dielectric layer 118, an intermediate dielectric layer 140 is deposited, photoimaged and developed to expose metal pad 112 and a surface region of second dielectric layer 118. Thereafter, the exposed surface region of second dielectric layer 118 is subjected to attack by a chemical such as permanganate or by reactive ion etching, to expose metal oxide particles at and near the surface of dielectric layer 118. A reducing agent including borohydride is then applied in a starved manner to convert the exposed metal oxide particles at the surface of dielectric layer 118 to islands of catalytic film having a surface resistivity of greater than about $10^6$ ohms per square. According to Brown et al., by limiting the amount of metal oxide in dielectric layer 118 to about ten weight percent or less, sufficient oxide is present to form a thin discontinuous catalytic film. This discontinuous film, composed of islands of catalytic film, assures that excessive and uncontrolled plating does not occur on the surface of dielectric layer 118. Those skilled in the art will appreciate that, if the above steps of exposing and converting the particles is not performed, dielectric layer 118 can be used as a permanent dielectric layer as depicted in FIG. 3, and can be subjected to typical printed circuit environments, including electroless plating, without effect or change.

FIG. 5 further shows metal regions 144 plated onto the exposed region of second dielectric layer 118, as well as metal 146 plated onto metal pad 112. If desired to maximize the combined volume of the recess above pad 112, metal 146 overlying pad 112 can be prevented by appropriately passivating pad 112 in accordance with known techniques. Third dielectric layer 130 is also shown as being plated through a dielectric layer 142, illustrating the manner in which the above steps can be repeated to yield a metal region 148 on the multi-layer circuit board construction characterized by the upper surface of the circuit board having a greater height above pad 112, and therefore a greater recess volume.

Finally, FIGS. 6 and 7 represent a third embodiment of this invention which is particularly tailored for the use of a conductive adhesive to attach a flip chip to a circuit board. As with the embodiment of FIGS. 3 and 4, a terminal pattern for a flip chip is formed on a substrate 210 by a number of metal pads 212, of which one is shown. Again, substrate 210 can be a variety of materials, including a printed circuit layer of a multi-layer circuit board. Shown overlying substrate 210 and surrounding metal pad 212 is a first dielectric layer 214 in which an opening 216 has been formed. As with the previous embodiments of this invention, pad 212 can be formed using opening 216 as its boundary to promote planarity and registration. Also in accordance with the previous embodiments, dielectric layer 214 is composed of a resin mixture containing a photosensitive material such that dielectric layer 214 is photodefinable, and photoimaging and development techniques can be employed to pattern opening 216 in dielectric layer 214. A suitable thickness for dielectric layer 214 is about fifteen micrometers, though greater or lesser thicknesses are possible. As before, opening 216 is preferably sized to expose the entire metal pad 212 beneath dielectric layer 214, and a precise volume is achieved for a recess 224 formed by opening 216 and delineated by the upper surface of metal pad 212 and a surrounding surface region 222 of dielectric layer 214. As with the previous embodiments, a second photodefinable dielectric layer 218 is shown having a precisely-defined opening 220 that exposes metal pad 212 and surface region 222 of first dielectric layer 214, resulting in an accurately-determinable volume for a second recess 226 formed by opening 220 and delineated by surface region 222 of dielectric layer 214 and a surrounding surface region 228 of second dielectric layer 218.

According to this embodiment of the invention, a conductive adhesive 232 is selectively deposited on pad 212 in an amount sufficient to fill at least first recess 224, but less than the combined volumes of first and second recesses 224 and 226, as shown in FIG. 7. FIG. 7 further shows a flip chip 236 positioned over substrate 210 such that its terminal bumps 238 are received in recesses 224 and 226 and contact adhesive 232 so as to be electrically interconnected with metal pads 212. As is apparent from FIG. 7, the size of each opening 220 in second dielectric layer 218 is such that any excess adhesive 232 displaced by terminal bumps 238 is at least partially accommodated by recesses 226, such that recesses 226 serve as escape volumes for adhesive 232 as flip chip 236 is forced downward during assembly. In this manner, sufficient adhesive 232 can be deposited to ensure reliable attachment of flip chip 236 to substrate 210, yet conductive adhesive 232 is prevented from causing a short between adjacent terminal bumps 238 of flip chip 236 and adjacent metal pads 212 on substrate 210. If desired, the sizes of recesses 224 and 226 can be precisely controlled such that recess 226 accommodates the excess adhesive 232 even after the lower surface of flip chip 236 abuts upper surface 228 of second dielectric layer 218.

Those skilled in the art will appreciate that the method and circuit board construction of this invention provides an uncomplicated method of reliably attaching a flip chip to its terminal pattern. While our invention has been described in terms of a preferred embodiment, it is apparent that other forms could be adopted by one skilled in the art, for example by modifying processing parameters, substituting appropriate materials, or utilizing the process of this invention within different applications or other processes. Accordingly, the scope of our invention is to be limited only by the following claims.

The embodiments of the invention in which an exclusive property or privilege is claimed are defined as follows:

1. A method for attaching a microelectronic device having a terminal to a substrate, the method comprising the steps of:

forming a metal region and a dielectric layer on the substrate, the metal region having a surface lying in a first plane, said dielectric layer having a surrounding dielectric surface region about the metal region and lying in a second plane above the first plane, such that a first recess is delineated by and between the first and second planes;

depositing a dielectric material on the surrounding dielectric surface region and the metal region, the dielectric material having a surface in a third plane above the first plane and the second plane;

forming an opening in the dielectric material so as to expose at least a portion of the metal region and a portion of the surrounding dielectric surface region, the opening forming a second recess having a volume delineated by and between the second and third planes, the opening forming a wall in the dielectric material that surrounds the portion of the metal region and the portion of the surrounding dielectric surface region;

depositing a conductive material on the metal region and within at least a portion of the first recess; and positioning the microelectronic device on the substrate such that the terminal of the microelectronic device is received in at least the second recess and contacts the conductive material so as to be electrically interconnected with the metal region.

2. A method as recited in claim 1 wherein the dielectric material is a photodefinable resin and the step of forming an opening entails photoimaging and developing the opening in the photodefinable resin.

3. A method as recited in claim 1 wherein the surrounding dielectric surface region is formed by depositing a photodefinable resin on the substrate and the metal region, and then photoimaging and developing an opening in the photodefinable resin so as to expose the metal region, such that an upper surface of the photodefinable resin forms the surrounding dielectric surface region.

4. A method as recited in claim 1 wherein the metal region and the surrounding dielectric surface region are formed by depositing a photodefinable resin on the substrate, photoimaging and developing an opening in the photodefinable resin, and then depositing a metal in the opening so as to form the metal region, an upper surface of the photodefinable resin forming the surrounding dielectric surface region.

5. A method as recited in claim 1 wherein the step of depositing a conductive material comprises depositing a conductive adhesive.

6. A method as recited in claim 1 wherein the step of depositing a conductive material comprises depositing a solder paste.

7. A method as recited in claim 6 further comprising the step of reflowing the solder paste prior to positioning the microelectronic device so as to form a solder bump on the metal region.

8. A method as recited in claim 6 further comprising the step of reflowing the solder paste only after positioning the microelectronic device.

9. A method as recited in claim 1 wherein the conductive material is deposited in the first and second recesses using the dielectric material as a mask such that both the first and second recesses are each entirely filled by the conductive material.

10. A method for reflow soldering a flip chip having a terminal to a substrate, the method comprising the steps of:

depositing a first photodefinable resin on the substrate so as to form a first dielectric layer, the first dielectric layer having an upper surface in a first plane;

photoimaging and developing an opening in the first dielectric layer;

forming a metal region on the substrate within the opening in the first dielectric layer, the metal region having an upper surface lying in a second plane below the first plane containing the upper surface of the first dielectric layer, the opening in the first dielectric layer forming a first recess having a volume delineated by and between the first and second planes;

depositing a second photodefinable resin on the first dielectric layer and the metal region so as to form a second dielectric layer, the second dielectric layer having an upper surface in a third plane above the first plane containing the upper surface of the first dielectric layer and above the second plane containing the upper surface of the metal region;

photoimaging and developing an opening in the second dielectric layer so as to expose the metal region and an annular surface region of the first dielectric layer surrounding the metal region, the opening forming a second recess having a volume delineated by and between the first and third planes, the opening forming a wall in the second dielectric layer that surrounds the metal region and the surface region of the first dielectric layer;

depositing a solder material on the metal region; and positioning the flip chip on the substrate such that the terminal of the flip chip is received in the first and second recesses and contacts the solder material.

11. A method as recited in claim 10 wherein the solder material is a solder paste, the method further comprising the step of reflowing the solder paste prior to positioning the flip chip so as to form a solder bump on the metal region.

12. A method as recited in claim 10 wherein the solder material is a solder paste, the method further comprising the step of reflowing the solder paste only after positioning the flip chip.

13. A method as recited in claim 10 wherein the solder material is deposited on the metal region using the second dielectric layer as a mask, such that both of the first and second recesses are filled by the solder material.

14. A method as recited in claim 10 further comprising the steps of treating the second dielectric layer such that the second dielectric layer has a plateable surface, and then selectively plating the plateable surface of the second dielectric layer after the step of photoimaging and developing the opening in the second dielectric layer.

15. A method for attaching a flip chip having a terminal to a substrate, the method comprising the steps of:

depositing a first photodefinable resin on the substrate so as to form a first dielectric layer, the first dielectric layer having an upper surface in a first plane;

photoimaging and developing an opening in the first dielectric layer;

forming a metal region on the substrate within the opening in the first dielectric layer, the metal region having an upper surface lying in a second plane below the first plane containing the upper surface of the first dielectric layer, the opening in the first dielectric layer forming a first recess having a volume delineated by and between the first and second planes;

depositing a second photodefinable resin on the first dielectric layer and the metal region so as to form a second dielectric layer, the second dielectric layer having an upper surface in a third plane above the first plane containing the upper surface of the first dielectric layer and above the second plane containing the upper surface of the metal region;

photoimaging and developing an opening in the second dielectric layer so as to expose the metal region and an annular surface region of the first dielectric layer surrounding the metal region, the opening forming a second recess having a volume delineated by and between the second and third planes, the opening forming a wall in the second dielectric layer that surrounds the metal region and the surface region of the first dielectric layer;

depositing a conductive adhesive in the first recess such that the conductive adhesive contacts the metal region;

positioning the flip chip on the substrate such that the terminal of the flip chip contacts the conductive adhesive so as to be electrically interconnected with the metal region; and forcing the terminal into the first and second recesses.

16. A method as recited in claim 15 wherein the step of depositing the conductive adhesive entails filling the first recess such that a portion of the conductive adhesive in the first recess is displaced into the second recess during the forcing step.

17. A method as recited in claim 15 wherein the forcing step results in the flip chip abutting the upper surface of the second dielectric layer.

18. A method as recited in claim 15 wherein the forcing step results in the second recess being completely filled by a portion of the conductive adhesive.

* * * * *